US010629518B2

(12) United States Patent
Sanchez et al.

(10) Patent No.: US 10,629,518 B2
(45) Date of Patent: Apr. 21, 2020

(54) INTERNALLY-SHIELDED MICROELECTRONIC PACKAGES AND METHODS FOR THE FABRICATION THEREOF

(71) Applicant: NXP USA, INC., Austin, TX (US)

(72) Inventors: Audel Sanchez, Tempe, AZ (US); Lakshminarayan Viswanathan, Phoenix, AZ (US); Vikas Shilimkar, Chandler, AZ (US); Ramanujam Srinidhi Embar, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/116,686

(22) Filed: Aug. 29, 2018

(65) Prior Publication Data

US 2020/0075463 A1     Mar. 5, 2020

(51) Int. Cl.
*H01L 23/495*     (2006.01)
*H01L 23/29*     (2006.01)
(Continued)

(52) U.S. Cl.
CPC ...... *H01L 23/49503* (2013.01); *H01L 21/565* (2013.01); *H01L 23/298* (2013.01); *H01L 23/3107* (2013.01); *H01L 23/49548* (2013.01); *H01L 24/48* (2013.01); *H01L 2224/45012* (2013.01); *H01L 2224/48247* (2013.01); *H01L 2924/181* (2013.01)

(58) Field of Classification Search
CPC ............... H01L 23/49503; H01L 24/48; H01L 23/49548; H01L 21/565; H01L 23/298; H01L 23/3107; H01L 2224/45012; H01L 2924/181; H01L 2224/48247
See application file for complete search history.

(56) References Cited

U.S. PATENT DOCUMENTS 5,122,862 A    6/1992   Kajihara et al.
6,747,879 B2   6/2004   Baker
(Continued)

OTHER PUBLICATIONS

Kapitza ("Cabling Against Inductive Coupling," EMC Meeting, DESY, Mar. 26, 2012) (Year: 2012).*
(Continued)

*Primary Examiner* — Yasser A Abdelaziez

(57) ABSTRACT

Internally-shielded microelectronic packages having increased resistances to electromagnetic cross-coupling are disclosed, as are methods for fabricating such microelectronic packages. In embodiments, the internally-shielded microelectronic package includes a substrate having a frontside and a longitudinal axis. A first microelectronic device is mounted to the frontside of the substrate, while a second microelectronic device is further mounted to the frontside of the substrate and spaced from the first microelectronic device along the longitudinal axis. An internal shield structure includes or consists of a shield wall, which is positioned between the first and second microelectronic devices as taken along the longitudinal axis. The internal shield structure is at least partially composed of a magnetically-permeable material, which decreases electromagnetic cross-coupling between the first and second microelectronic devices during operation of the internally-shielded microelectronic package.

20 Claims, 10 Drawing Sheets

(51) Int. Cl.
  *H01L 23/31* (2006.01)
  *H01L 23/00* (2006.01)
  *H01L 21/56* (2006.01)

(56) References Cited

U.S. PATENT DOCUMENTS

| | | | |
|---|---|---|---|
| 6,984,867 B2 * | 1/2006 | Nakajima | B82Y 10/00 |
| | | | 257/433 |
| 7,429,790 B2 | 9/2008 | Condie et al. | |
| 8,030,763 B2 | 10/2011 | Romero et al. | |
| 8,698,291 B2 | 4/2014 | Sanchez et al. | |
| 8,742,555 B2 | 6/2014 | Wen et al. | |
| 9,224,699 B2 | 12/2015 | Jang et al. | |
| 9,312,817 B2 | 4/2016 | Aaen et al. | |
| 9,349,693 B2 | 5/2016 | Lakshminarayan et al. | |
| 9,401,342 B2 | 7/2016 | Meen Kuo et al. | |
| 9,401,682 B2 | 7/2016 | Blednov et al. | |
| 9,450,547 B2 * | 9/2016 | Szymanowski | H01L 23/3121 |
| 2005/0016750 A1 | 1/2005 | Zimmerman | |
| 2014/0022020 A1 | 1/2014 | Aaen et al. | |
| 2015/0070236 A1 | 3/2015 | Walters et al. | |
| 2016/0380606 A1 * | 12/2016 | Limjoco | H01L 23/3107 |
| | | | 361/767 |
| 2017/0186697 A1 * | 6/2017 | Dias | H01L 23/552 |
| 2017/0345793 A1 | 11/2017 | Miyairi | |

OTHER PUBLICATIONS

Sanchez, A., U.S. Appl. No. 15/670,429 entitled, "Molded Air Cavity Packages and Methods for the Production Thereof," filed Aug. 7, 2018.

Srinidhi Embar, R., U.S. Appl. No. 16/107,089 entitled, "Electro-magnetically-Shielded Microelectronic Assemblies and Methods for the Fabrication Thereof," filed Aug. 21, 2018.

* cited by examiner

000
INTERNALLY-SHIELDED MICROELECTRONIC PACKAGES AND METHODS FOR THE FABRICATION THEREOF

TECHNICAL FIELD

Embodiments of the present invention relate generally to microelectronics and, more particularly, to internally-shielded microelectronic packages and methods for the production thereof.

ABBREVIATIONS

Abbreviations appearing relatively infrequently in this document are defined upon initial usage, while abbreviations appearing more frequently in this document are defined below:
ACM—air cavity molded or molded air cavity;
Cu—copper;
EM—electromagnetic;
PA—power amplifier;
PCB—printed circuit board; and
RF—radio frequency.

BACKGROUND

EM cross-coupling (more informally, "cross-talk") can occur between separate signal paths within circuitry integrated into or housed within microelectronic packages. EM cross-coupling may be particularly problematic in the context of small scale, high power RF applications. Consider, for example, an RF microelectronic package containing N-way Doherty PA circuitry and having a relatively compact form factor. By common design, such a microelectronic package may contain two or more high gain transistor die attached to a base flange in a side-by-side relationship. Bondwire arrays may electrically interconnect the transistor die with other circuit elements, such as the package terminals, integrated passive capacitors, or other devices contained within the package. Due to the close proximity of the transistor die and their corresponding bondwire arrays, EM cross-coupling can occur during package operation and, if sufficiently severe, may limit the performance of the RF PA circuitry; e.g., EM cross-coupling may displace impedances presented to the transistor die, which may detract from RF performance in terms of linearity, efficiency, peak power, or gain. Similarly, EM cross-coupling can likewise limit the performance of microelectronic devices containing other types of circuitry, which include signal paths extending in relatively close proximity and carrying distinct electrical signals.

There thus exists an ongoing demand for the provision of microelectronic packages having reduced susceptibility to EM cross-coupling, even when containing (e.g., RF) circuitry operated at higher power levels and possessing relatively compact form factors. Ideally, embodiments of such microelectronic assemblies would provide enhanced shielding of adjacent signal paths from EM cross-coupling, while maintaining high levels of package performance and remaining cost effective to manufacture. Similarly, it is desirable to provide methods for manufacturing microelectronic packages having such favorable characteristics. Other desirable features and characteristics of embodiments of the present disclosure will become apparent from the subsequent Detailed Description and the appended Claims, taken in conjunction with the accompanying drawings and the foregoing Background.

BRIEF DESCRIPTION OF THE DRAWINGS

At least one example of the present invention will hereinafter be described in conjunction with the following figures, wherein like numerals denote like elements, and.

Figure 1:
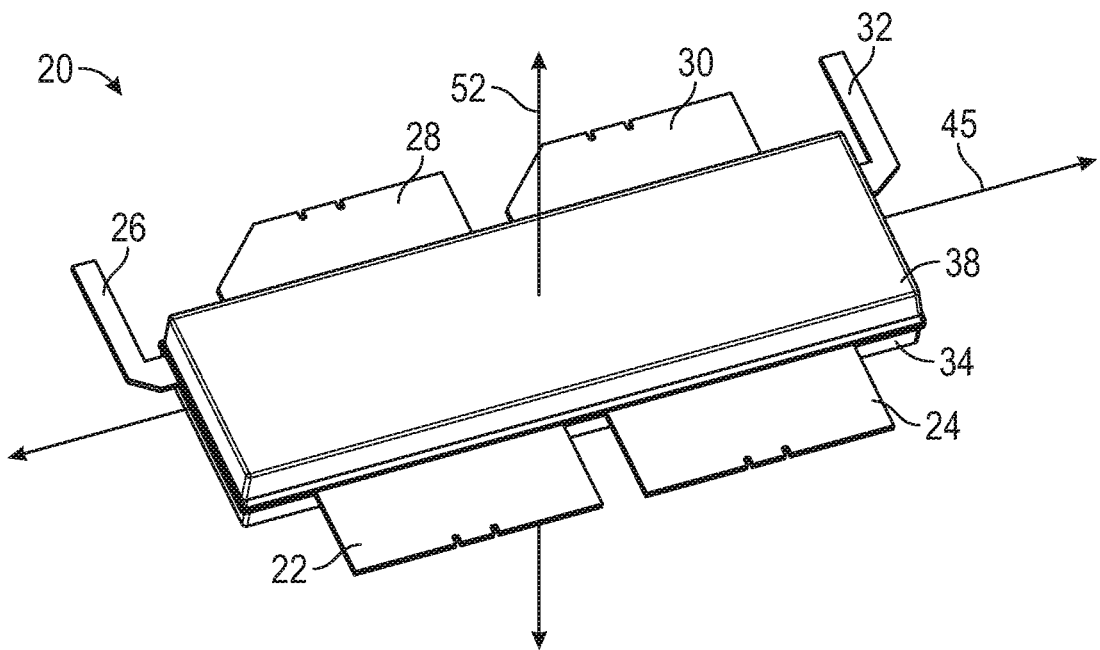
FIGS. 1 and 2 are upper and lower isometric views of an internally-shielded ACM package, respectively, which includes a leadframe-integrated shield structure and which is illustrated in accordance with an exemplary embodiment of the present disclosure.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect.

The term "air cavity package," as appearing throughout this document, refer to a microelectronic package including a sealed cavity at least partially filled with a gas, regardless of the internal pressure within the cavity. The "air cavity" of the air cavity package may be enclosed in an open air environment and, thus, may contain air at approximately 1 atmosphere pressure with slight variations depending upon elevation and processing temperatures during package manufacture. In other implementations, the "air cavity" of the air cavity package may be enclosed in a partially evacuated chamber or a chamber containing an inert gas, such as argon, during manufacture and, thus, may not contain pure air in all instances. The term "air cavity," then, should be understood as referring to a gas-containing cavity, which may or may not be partially evacuated and which is sealed from the ambient environment. The seal formed between the air cavity and the ambient environment may not be hermetic, as strictly defined, but rather may be a low leakage seal having a gross leakage rate falling within acceptable parameters. Thus, as appearing herein, a cavity is considered "sealed" when little to no leakage (bubbles) are observed from the cavity's exterior when the cavity is filled with air or another gas and the air cavity package is fully immersed in a liquid (e.g., Perfluoropolyether (PFPE)) at approximately 125 degrees Celsius (° C.). Finally, the term "molded air cavity package" and the corresponding term "ACM package" refer to an air cavity package, as previously defined, and further including a package body principally or exclusively formed from one or more molded materials.

DEFINITIONS

The following definitions apply throughout this document. Those terms not expressly defined here or elsewhere in this document are assigned their ordinary meaning in the relevant technical field.

Electrically-conductive material—A material having an electrical resistivity less than 1 milli-Ohm millimeter at 20° C.

Internal shield structure—A structure including or consisting of a central shield wall contained within a microelectronic package and decreasing the electromagnetic cross-coupling between different signal paths in at least some instances of package operation.

Magnetically-permeable material—A material having a relative magnetic permeability ($\mu_r$) exceeding 1000.

Mu metal—any alloy principally composed of nickel (Ni) and iron (Fe), by weight, and having a relative magnetic permeability ($\mu_r$) exceeding 10,000.

Relative magnetic permeability ($\mu_r$)—the ratio of magnetic permeability of a material or medium ($\mu$) over the magnetic permeability of free space ($\mu_0$).

Supermalloy—an alloy predominately composed of Ni, Fe, and molybdenum (Mo), by weight, and having a relative magnetic permeability exceeding 10,000.

Overview

Internally-shielded microelectronic packages having increased resistances to EM cross-coupling are disclosed, as are methods for fabricating such microelectronic packages. Embodiments of the microelectronic package contain unique internal shield structures, which provide enhanced shielding between adjacent circuit elements (e.g., interconnect features or microelectronic devices) contained within the packages and carrying distinct electrical signals during package operation. The internal shield structure can provide enhanced shielding principally from a magnetic perspective, from an electrical perspective, or both, depending upon the particular construction and composition of the shield structure. In various embodiments, the internal shield structure is at least partially composed of a body or layer of magnetically-permeable material, which is positioned and dimensioned to reduce magnetic cross-coupling between adjacent interconnect features or microelectronic devices located within the microelectronic package. Additionally or alternatively, the internal shield structure may be at least partially composed of an electrically-conductive material to further reduce electric cross-coupling between parallel signal paths or adjacent microelectronic devices. In this latter case, the internal shield structure (or at least the electrically-conductive portion thereof) may be electrically grounded to, for example, reduce eddy current losses and provide other performance benefits. Generally, then, embodiments of the internal shield structure may enhance package performance by reducing or eliminating EM cross-coupling, which may otherwise occur absent the provision of the internal shield structure.

The internal shield structure may possess different dispositions within a given microelectronic package, noting that a single package may contain two or more shield structures in certain instances. In some implementations, the internal shield structure may include a main body having wall-like or plate-like form factor (herein, "a shield wall"), which partitions adjacent microelectronic devices (e.g., semiconductor die) attached to a flange or other substrate contained in the microelectronic package. The shield wall may be oriented to extend substantially orthogonal to the frontside of a flange and, perhaps, may be imparted with a height equal to or greater than the height or heights of the microelectronic device(s) mounted to the flange. In certain cases, when the microelectronic package is fabricated utilizing a leadframe-based manufacturing approach, the internal shield structure may be integrally formed with the leadframe for increased manufacturing efficiency. For example, in such cases, the shield wall may be provided as a flat rectangular or blade-like section of the leadframe, which is bent upwardly or "flipped up" into an upright or deployed position during package manufacture. In other embodiments, the internal shield structure can be provided as discretely-fabricated piece or insert, which is joined to the package infrastructure, such as the leadframe or base flange, during package manufacture. In still other embodiments in which the package contains an air cavity, the internal shield structure can be integrally formed with or joined to the underside of a cover piece utilized to enclose the air cavity. All of the aforementioned embodiments can be combined, as well, to yield still further permutations of the present disclosure.

Embodiments of the internally-shielded microelectronic package can include various other features in addition to or in lieu of those set-forth above. For example, in some implementations, the internal shield structure may be fabricated to include one or more (often two) lateral extensions, which project outwardly from the package body and extend between neighboring sets of package leads to provide supplemental EM shielding at this location. When included within the microelectronic package, such lateral extensions may also extend onto and over a substrate, such as a PCB, to which the package is mounted; e.g., to further provide shielding between traces or other electrical routing features on the PCB. The lateral extensions may also facilitate electrical grounding of the internal shield structure. Additionally or alternatively, in instances in which the microelectronic package includes a base flange or other electrically-conductive substrate serving as a package terminal, the internal shield structure may be electrically coupled to the base flange by physical contact, through an electrically-conducive bonding material provided at a juncture between the shield structure and flange, or both. Such an approach may be useful when the internal shield structure contains an electrically-conductive portion or layer, which is desirably coupled to electrical ground through the base flange. In still other implementations, the internal shield structure may not be electrically grounded or may be electrically grounded in a different manner; e.g., by providing the microelectronic package with a dedicated lead extending from the shield structure to the exterior of the package for grounding purposes. Exemplary embodiments of internally-shield microelectronic packages and methods for fabricating such packages will now be described in conjunction with FIGS. 1-11.

Non-Limiting Example of an Internally-Shielded Microelectronic Package

Figure 2:
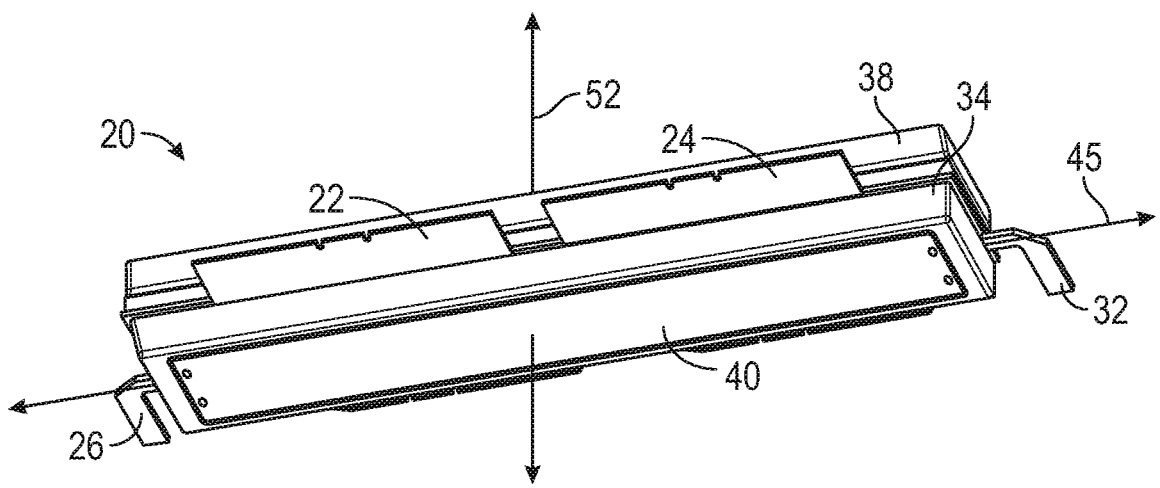
Figure 3:
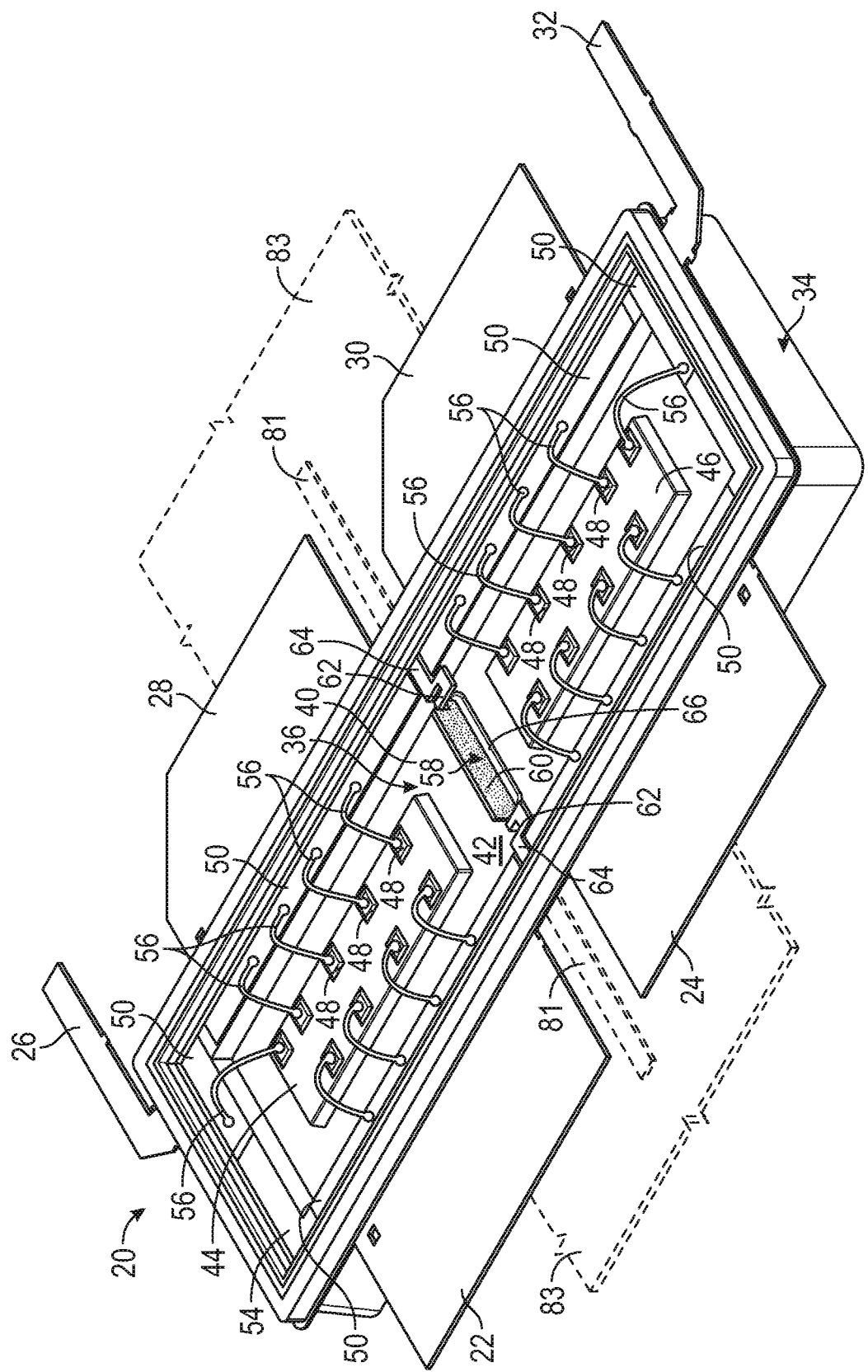
FIG. 3 is an isometric view of the internally-shielded ACM package shown in FIGS. 1-2, as illustrated with the cover piece removed to reveal the internal shield structure and other features contained within the exemplary package.

FIGS. 1-3 illustrate a microelectronic package 20 in accordance with an exemplary embodiment of the present disclosure. Microelectronic package 20 assumes the form of a leaded ACM package in the illustrated example and will consequently be referred to hereafter as "ACM package 20." ACM package 20 includes a number of package leads 22, 24, 26, 28, 30, 32, which project from a molded package body 34 for interconnection when package 20 is installed within a microelectronic module, system, or the like. In alternative embodiments, microelectronic package 20 may contain a different number and type of leads or may instead assume the form of a no-lead package. Molded package body 34 includes a peripheral sidewall, which defines or bounding the outer perimeter of an air cavity 36 (FIG. 3) located within package 20. Air cavity 36 is enclosed by a lid or cover piece 38 (FIGS. 1-2) positioned over and attached to molded package body 34; e.g., cover piece 38 may be sealingly bonded to the upper peripheral edge of package body 34 utilizing a bead of adhesive. Cover piece 38 is removed in FIG. 3 to reveal the interior of molded package body 34, air cavity 36, and a number of microelectronic devices 44, 46 contained in air cavity 36, as discussed more fully below. Molded package body 34 is formed in contact with and extends around or partially envelopes a substrate or base flange 40. As shown in FIG. 2, the lower principal surface or backside of base flange 40 may be exposed through a lower surface of molded package body 34 to facilitate electrical connection and/or efficient thermal contact with another body, chassis, or substrate on which package 20 may be installed.

As can be seen in FIG. 3, microelectronic devices 44, 46 are mounted to an upper principal surface or frontside 42 of base flange 40. Specifically, in the illustrated example, two microelectronic devices 44, 46 are located within air cavity 36 and bonded or otherwise attached to frontside 42 of base flange 40 in a side-by-side relationship. Microelectronic devices 44, 46 are spaced along a longitudinal axis of ACM package 20, which is represented by double-headed arrow 45 in FIGS. 1-2 and which extends parallel to package centerline 52. Microelectronic devices 44, 46 can be, for example, semiconductor die bearing integrated (e.g., RF) circuitry and having a number of bond pads 48 thereon. In other embodiments, ACM package 20 can contain a different number and type of microelectronic devices including various combinations of integrated passive devices, discretely-placed passive devices (e.g., capacitors, inductors, resistors, or diodes in the form of Surface Mount Devices (SMDS)), Microelectromechanical systems (MEMS) devices, semiconductor die, RF antenna structures, and optical devices, to list but a few examples.

When enclosed by bonding cover piece 38 (FIGS. 1-2) to molded package body 34, air cavity 36 may contain air, another inert gas (e.g., nitrogen), or a gas mixture. Air cavity 36 may or may not be partially evacuated or pressurized relative to the ambient environment, with the gaseous contents and pressure of air cavity 36 largely determined by the environment and temperature conditions during cover piece attachment. The hermicity of air cavity 36 will vary amongst embodiments, although ACM package 20 is usefully produced such that relatively little, if any, leakage occurs between cavity 36 and the ambient environment when cover piece 38 (FIGS. 1-2) is installed over and bonded to molded package body 34. In other embodiments, microelectronic package 20 may lack molded package body 34, in which case air cavity 36 may be peripherally bounded by one or more non-molded structures, such as a dielectric window frame. Alternatively, in further implementations, molded package body 34 may be formed as a solid mass of material or block of encapsulant following device attachment and interconnection, in which case package 20 may lack air cavity 36 altogether.

Base flange 40 can be any body of material, layered structure, or composite structure serving as a substrate or carrier supporting the microelectronic devices (i.e., devices 44, 46) located within air cavity 36. Accordingly, base flange 40 may assume the form of a metallic plate, slug, or other monolithic body in certain implementations. In other embodiments, base flange 40 can be fabricated from organic materials (e.g., a resin similar or identical to that from which printed circuit boards are produced) containing metal (e.g., Cu) coining. In still further instances, base flange 40 may have a multilayer metallic construction; e.g., base flange 40 may contain multiple thermally-conductive layers, which are bonded in a laminated arrangement. In many cases, base flange 40 will be predominately composed of one or more metals having relatively high thermal conductivies, such as Cu. As a specific example, in an embodiment in which base flange 40 is a layered or laminated structure, base flange 40 may include at least one Cu layer combined with at least one disparate metal layer having a coefficient of thermal expansion (CTE) less than that of the Cu layer. The disparate metal layer may be composed of, for example, Mo, a Mo—Cu alloy, or a Mo—Cu composite material. In this manner, base flange 40 may be imparted with both a relatively high thermal conductivity and a lower effective CTE, which is more closely matched to that of microelectronic devices 44, 46 and/or to that of molded package body 34. Base flange 40 may serve as an electrically-conductive terminal of ACM package 20, as a heatsink or heat spreader, or both in embodiments of package 20.

The inner terminal end portions of package leads 22, 24, 26, 28, 30, 32 extend into the package interior for connection to microelectronic devices 44, 46 contained within package 20. The inner terminal end portions of package leads 22, 24, 26, 28, 30, 32 are identified in FIG. 3 by reference numerals "50" and are referred to hereafter as the "proximal" lead portions; the term "proximal," and the antonym "distal," defined based upon relative proximity to the package interior and air cavity 36 (when present). Proximal lead portions 50 are exposed within the package interior along an inner peripheral ledge or bond pad shelf 54 of molded package body 34. In the illustrated example, proximal lead portions 50 are interconnected to corresponding bond pads 48 on devices 44, 46 utilizing a number of bondwires 56 to complete the desired wiring structure. For example, in one implementation, leads 22, 24 project from a first side of ACM package 20 and serve as input leads electrically coupled to the input (e.g., gate) terminals of microelectronic devices 44, 46; while leads 26, 28, 30, 30 project from a second, opposing side of package 20 and serve as output leads electrically coupled to the output (e.g., drain) terminal of devices 44, 46. In certain instances, base flange 40 may itself serve as a ground reference terminal of ACM package 20 and, therefore, may be electrically coupled to a source terminal of devices 44, 46. In other embodiments, different wiring architectures and other types of interconnect features (e.g., three dimensionally printed traces) may be employed.

ACM package 20 further contains an internal shield structure 58, which is at least partially and, perhaps, entirely contained within air cavity 36. As a point of emphasis, the particular form, disposition, composition, shape, and dimensions of internal shield structure 58 will vary among embodiments, as appropriate to suit a particular application or usage, providing shield structure 58 reduces EM cross-coupling between different signal paths during package operation. In many instances, and as indicated in FIG. 3, internal shield structure 58 will include a main body 60, which has a fin-like for plate-like form factor and which is referred to hereafter as "shield wall 60." Generally, shield wall 60 may be positioned within package 20 at a location between adjacent microelectronic devices, interconnect features, and/or other circuit elements, which carry disparate electrical signals and generate EM fields prone to interference during package operation absent the provision of internal shield structure 58. Accordingly, and as indicated in FIG. 3, shield wall 60 of internal shield structure 58 may be positioned between microelectronic devices 44, 46, as taken along longitudinal axis 45 (FIGS. 1-2), such that opposing principal surfaces of shield wall 60 may face devices 44, 46. Further, internal shield wall 60 may be oriented to extend orthogonally relative to base flange 40 such that the opposing principal surfaces of shield wall 60 form essentially right angles with flange frontside 42.

The dimensions and shape of main shield wall 60 will vary amongst embodiments. Generally, it may be desirable to maximize the height of shield wall 60, to the extent permitted by the dimensions of ACM package 20, to accommodate the reach of the core EM fields induced when package 20 is energized; the term "core EM fields," as appearing herein, referring to those portions of the induced EM fields of sufficient magnitude to warrant concern with respect to EM cross-coupling. Concurrently, manufacturing efficiency may be boosted by providing internal shield structure 58 as an integral part of a leadframe when a leadframe-based manufacturing approach is utilized to fabricated microelectronic package 20. One manner in which the height of shield wall 60 may be maximized, while allowing wall 60 and, more broadly, internal shield structure 58 to be produced as an integral part of a leadframe, is as follows. Internal shield structure 58 may be initially produced with shield wall 60 in a horizontally-oriented, non-deployed orientation, and shield wall 60 may be subsequently rotated into a deployed (vertically-oriented or upright) orientation following initial leadframe fabrication. In such embodiments, internal shield structure 58 may be further imparted with flexure portions 62 (hereafter, "flexures 62") having a serpentine form factor, which ease bending stresses when rotating shield wall 60 into the deployed orientation. As shown in FIG. 3, flexures 62 may be coupled opposing ends of shield wall 60 and opposing anchor regions 64, which are further included in structure 58 and which extend into molded package body 34 following the below-described overmolding process. Further description of the manner in which shield wall 60 may be initially produced in a non-deployed orientation and subsequently rotated or "flipped-up" into an upright, deployed orientation is provided below in conjunction with FIG. 5.

When provided as a part of a leadframe, internal shield structure 58 may be at least partially composed of the same material as are package leads 22, 24, 26, 28, 30, 32. For example, in this case, internal shield structure 58 and package leads 22, 24, 26, 28, 30, 32 may be provided as pieces of a leadframe composed of a first electrically-conductive material, such as metal or alloy containing Cu, Ni, aluminum (Al), silver (Ag), gold (Au), or a combination thereof as primary constituents, by weight. The leadframe, or at least a portion of the leadframe encompassing shield wall 60 of internal shield structure 58 may further be coated or covered with a second material, which has a higher magnetic permeability and a lower electrical conductivity than does the first electrically-conductive material. This second material is represented in FIG. 3 by dot stippling and may be applied by plating, sputter deposition, or utilizing another deposition process, depending upon the composition of the magnetically-permeable manner. Such a constructions allows internal shield structure 58 to provide enhanced shielding of both electrical and magnetic aspects of EM cross-coupling. In other embodiments, the leadframe from which internal shield structure 58 and package leads 22, 24, 26, 28, 30, 32 are formed may be composed of a magnetically-permeable metal, such as Mu metal, an iron-rich alloy (e.g., supermalloy), or an electrical steel, which is further plated with an electrically-conductive alloy in those regions in which electrical conduction is desired; e.g., the upper surfaces of leads 22, 24, 26, 28, 30, 32 including inner peripheral lead portions 50.

In embodiments in which internal shield structure 58 includes an electrically-conductive portion or layer in addition to a magnetically-permeable portion or layer, it may be desirable to couple shield structure 58 to electrical ground. In certain embodiments, this can be accomplished by providing an additional lead extending from internal shield structure 58 to the exterior of ACM package 20 for grounding purposes. More conveniently, however, internal shield structure 58 may be electrically coupled to base flange 40 when serving as a ground reference terminal of ACM package 20. In such embodiments, internal shield structure 58 may simply be placed in physical contact with base flange 40 to form the desired electrical connection. A more reliable connection can typically be formed, however, via the provision of an electrically-conductive body or layer of material provided at the juncture between the lower edge of shield wall 60 and flange frontside 42. To this end, shield wall 60 may be electrically coupled to flange frontside 42 through a body of an electrically-conductive material 66, such as a metal-filled epoxy, a sintered metallic material, or other electrically-conductive adhesive. Grounding of shield wall 60 of internal shield structure 58 in this manner may reduce eddy current loses, decrease RF mismatch issues (when applicable), lessen memory effects (hysteresis), and provide other benefits. This notwithstanding, internal shield structure 58 may not be electrically coupled to base flange 40 or to electrical ground in further embodiments.

Advantageously, EM cross-coupling that may otherwise occur within package 20, particularly when operated at higher power levels and having a relatively small form factor, is reduced or eliminated via the provision of internal shield structure 58. The enhanced resistivity to EM cross-coupling afforded by internal shield structure 58 may be especially beneficial when, for example, package 20 contains an N-way (e.g., dual path) Doherty PA circuitry. In such embodiments, microelectronic devices 44, 46 may be high gain transistor die, such as laterally-diffused metal-oxide-semiconductor (LDMOS), gallium nitride (GaN), or gallium arsenide (GaAs) transistors. In such embodiments, internal shield structure 58 may reduce EM cross-coupling between such die (devices 44, 46) and bondwire arrays 56 to prevent displacement of the impedances delivered to the die to maintain the linearity of the peaking and carrier signal paths within package 20. This example notwithstanding, microelectronic package 20 can contain other types of microelectronic devices and is not limited to any particular application or function. Further, in alternative embodiments, microelectronic package 20 can contain multiple shield structures similar or identical to internal shield structure 58 and distributed within air cavity 36; e.g., package 20 can contain three or more microelectronic devices with each neighboring pair of devices separated by a shield structure in further implementations. Finally, while having a leadframe-based construction in the illustrated example and in the exemplary manufacturing process discussed below in conjunction with FIGS. 4-7, microelectronic package 20 need not contain a leadframe in all embodiments.

In embodiments, internal shield structure 50 may be fabricated to further include certain features or projections, which extend from the package interior to the package exterior. Examples of such features (hereafter, "shield extensions 81") are shown in FIG. 3. Shield extensions 81 may be omitted in versions of ACM package 20 and are consequently illustrated in phantom (dashed line). When provided, shield extensions 81 may project away from main shield wall 60 to the exterior of package body 34 to, for example, provide enhanced EM isolation between adjacent sets of leads 22, 24 and 28, 30. In this regard, shield extensions 81 may extend from opposing sides of shield wall 60 to the package exterior, with extensions 81 joined to shield wall 60 through flexures 62 and anchor regions 64 as shown. Further, should ACM package 20 be mounted to a PCB or other substrate having electrically-conductive routing features thereon, shield extensions 81 may extend over and onto the upper surface of the PCB to provide shielding between adjacent metal traces (or other routing features) and/or to facilitate electrically grounding of shield wall 60 and internal shield structure 58, generally. This possibility is further indicated in FIG. 3, which depicts two limited regions 83 of a PCB over which extensions 81 may extend when ACM package 20 is installed on the PCB. The particular dimensions of extensions 81, when included in package 20, will vary among implementations; however, in certain embodiments, extensions 81 may extend from package body 34 beyond leads 22, 24, 28, 30. In further embodiments, internal shield structure 58 only include a single shield extension 81 or may lack extensions 81 altogether.

Examples of Air Cavity Package Fabrication Methods

Figure 4:
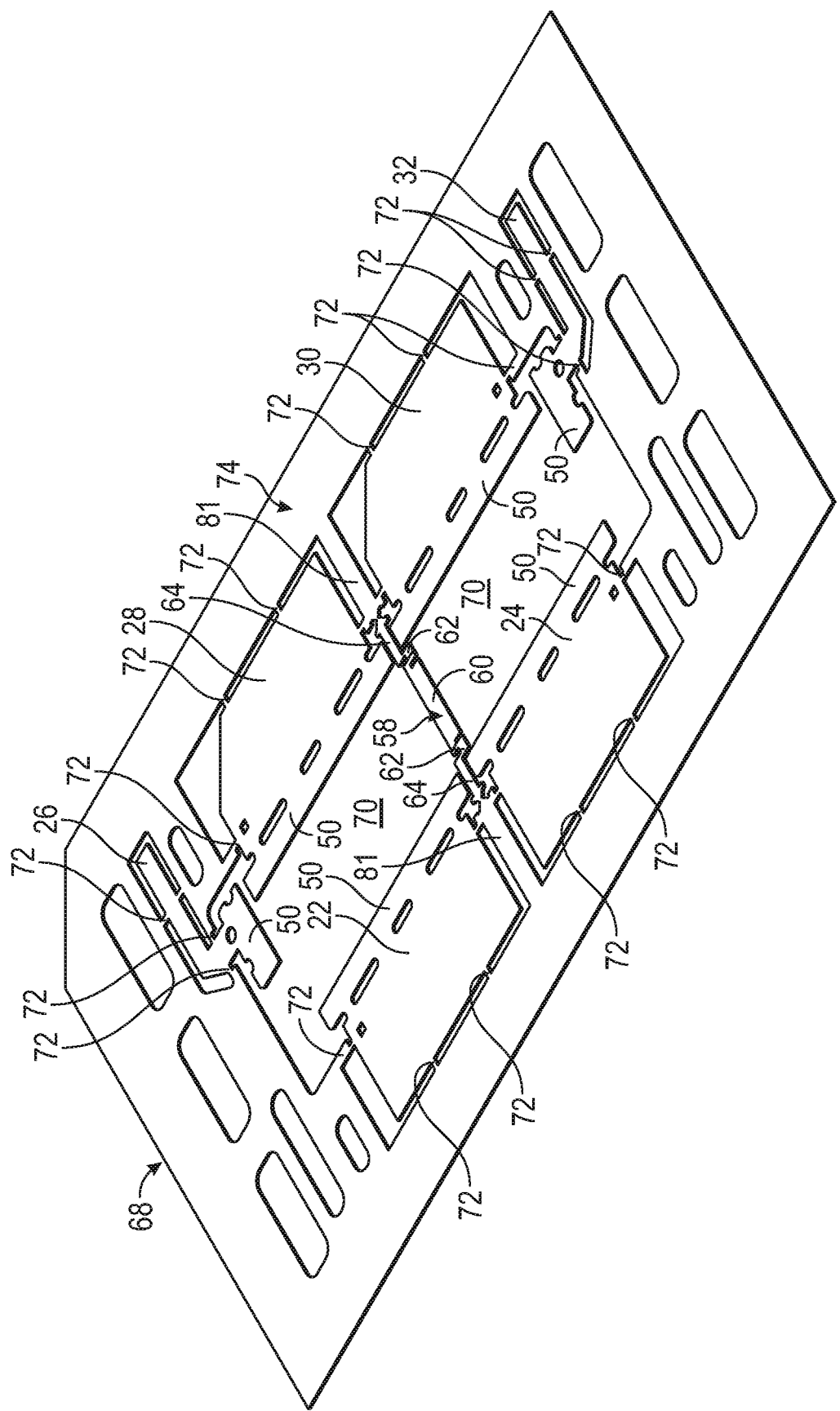
FIGS. 4-7 illustrate the internally-shielded ACM package shown in FIGS. 1-3, as depicted at various stages of manufacture and fabricated in an accordance an exemplary ACM package fabrication process.
Figure 5:
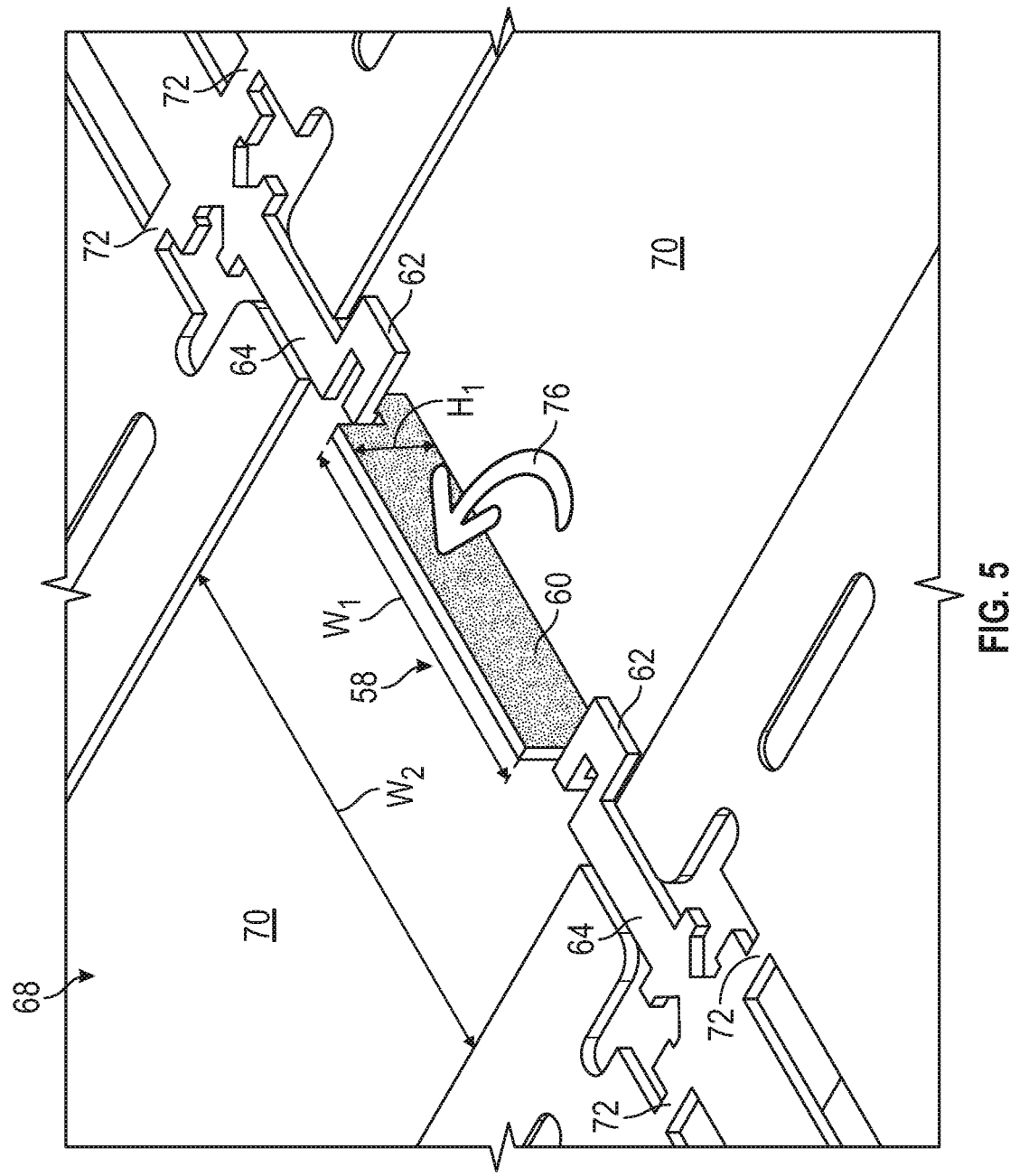

Whether produced on an individual basis or in parallel with a number of other ACM packages, ACM package 20 is conveniently fabricated utilizing a leadframe-based manufacturing approach. In this regard, ACM package 20 may be manufactured to incorporate a leadframe, which contains package leads 22, 24, 26, 28, 30, 32 and other physically-interconnected features, at least some of which may be removed during the course of ACM package fabrication. An example of a leadframe 68 suitable for usage in the manufacture of ACM package 20 is shown in FIG. 4. In this example, leadframe 68 is fabricated as a relatively thin strip or plate-like body composed of a metallic material, such as Cu or a Cu-based alloy. If desired, ACM package 20 may be fabricated as a discrete unit by individually processing leadframe 68 as a pre-singulated structure. Process efficiency will typically be increased and manufacturing costs lowered, however, by manufacturing ACM package 20 in parallel with a relatively large number of similar ACM packages. In this regard, ACM package 20 may be produced in parallel with other, non-illustrated ACM packages by concurrently processing a plurality of leadframes interconnected as a leadframe array. Such a leadframe array can contain relatively large number of leadframes arranged in, for example, a two dimensional grid layout or a linear strip layout.

The body of leadframe 68 is machined (e.g., stamped), etched, laser cut, or otherwise processed to define the various leadframe features. In addition to package leads 22, 24, 26, 28, 30, 32, these features include internal shield structure 58, central openings 70 on opposing sides of structure 58, and a number of connective fingers or spars (herein, "dam bars 72"), only a few of which are labeled. Dam bars 72 join package leads 22, 24, 26, 28, 30, 32 and internal shield structure 58 to the plate-like body of leadframe 68. Additionally, dam bars 72 may facilitate handing and positioning of leadframe 68 leading into and, perhaps, through the molding process. After molding, dam bars 72 may be severed and removed along with other sacrificial leadframe portions, such as outer peripheral leadframe portion 74. Regions 81 of leadframe 68 may likewise be trimmed away or removed in embodiments; or, instead, one or both of regions 81 of leadframe 68 may be left intact to form shield extensions 81 described above in conjunction with FIG. 3. Outer peripheral leadframe portion 74 may include various openings or cutouts facilitating handling of leadframe 68 during ACM package fabrication.

At the stage of manufacture shown in FIG. 4, main shield wall 60 of internal shield structure 58 resides in an initial vertically-extending, non-deployed orientation. At a subsequent stage of manufacture, and as indicated by arrow 76 in FIG. 5, shield wall 60 is rotated into an upright, deployed orientation. As noted above, flexures 62 of internal shield structure 58 bend or deform to accommodate angular rotation of shield wall 60 in this manner. The particular juncture at which shield wall 60 is rotated into its deployed position can vary among embodiments, but will typically occur prior to overmolding and the formation of package body 34, as discussed below in connection with FIG. 6. As noted briefly before, forming internal shield structure 58 in this manner enables the height of shield wall 60 to be maximized, while further allowing structure 58 to be formed as an integral part of leadframe 68. The height of shield wall 60 is measured along an axis parallel to package centerline 52 (FIGS. 1-2) and is identified in FIG. 5 by double-headed arrow Hi. In embodiments, Hi may be dimensioned to be equivalent to or greater than the height of devices 44, 46, as taken along axes parallel to centerline 52 (FIGS. 1-2) and orthogonal to flange frontside 42. Shield wall 60 is also imparted with a maximum width, as identified by double-headed arrow $W_1$. The width ($W_1$) of main shield wall 60 is further usefully maximized and, in embodiments, may be at least one half the width of openings 70, as measured between the inner end portions of leads 22, 28 and leads 24, 30 (further identified in FIG. 5 by double-headed arrow $W_2$). Similarly, the shield width $W_1$ may be at one half the distance between opposing edges of bond pad shelf 54, shown in FIG. 4.

After rotation of shield wall 60 into its deployed or upright orientation, base flange 40 is next positioned adjacent leadframe 68 utilizing, for example, a pick-and-place tool. Base flange 40 can be positioned with respect to leadframe 68 by movement of flange 40, by movement of leadframe 68, or a combination thereof. As a specific example, and referring to the exemplary orientation of base flange 40 and leadframe 68 shown in the drawing figures, base flange 40 may be placed on a temporary support structure, carrier, or fixture; and leadframe 68 may be lowered onto flange 40 to achieve the desired positioning. Such an approach may be useful when a plurality of ACM packages are manufactured in parallel. In this case, an appropriate number of base flanges can be distributed across such a carrier or fixture, and a leadframe array may then be lowered into its desired position to concurrently position the interconnected leadframes relative to the array of base flanges. Alternatively, the illustrated orientation of base flange 40 and leadframe 68 may be inverted, and base flange 40 may be lowered onto leadframe 68 during flange-leadframe positioning. Base flange 40 may further be secured to leadframe 68 in some manner, such as by staking, spot welding, bonding, or the like; however, this is not necessary in all embodiments.

Figure 6:
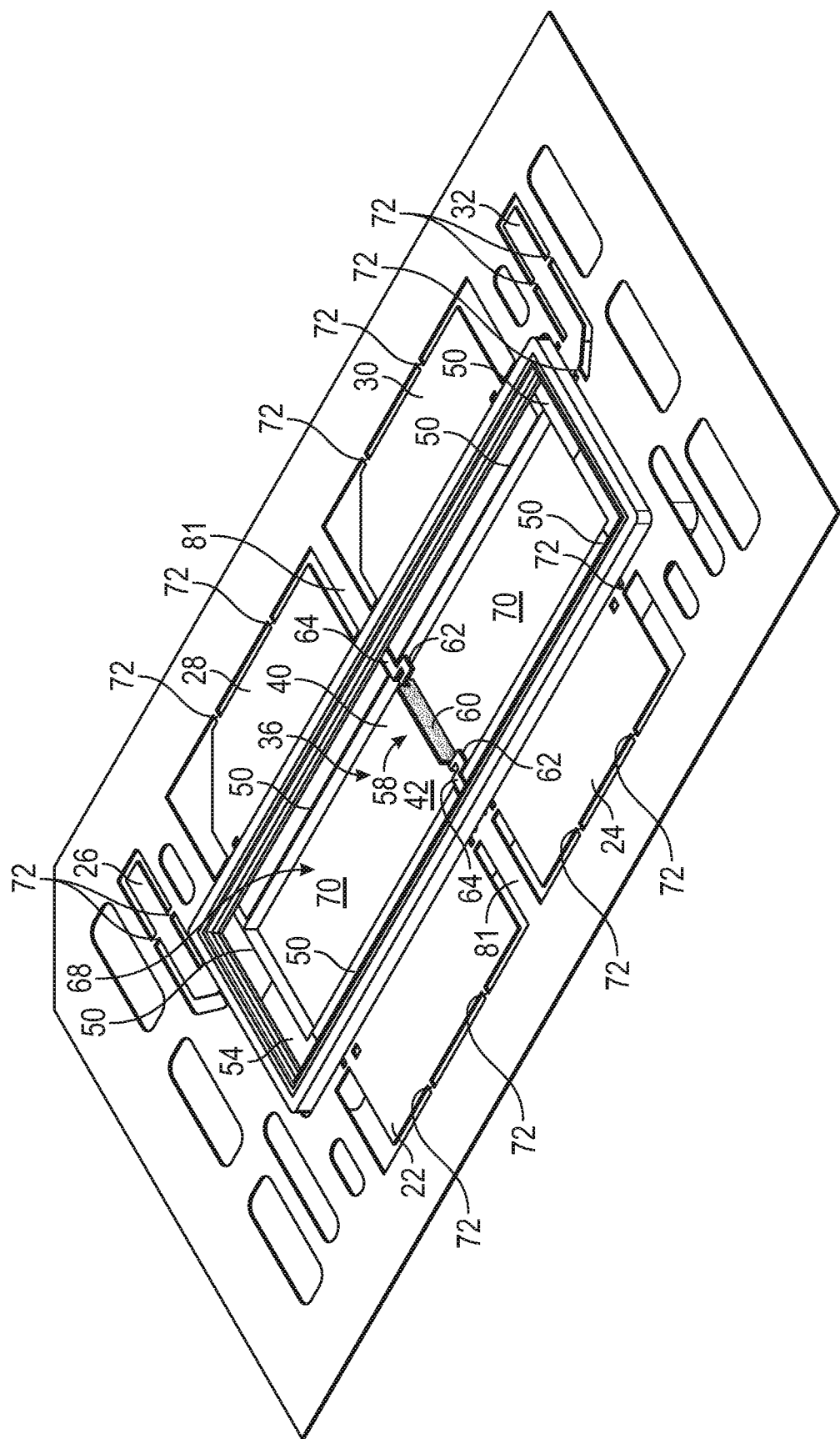

Advancing to FIG. 6, overmolding is next conducted to create molded package body 34, which envelopes selected regions of leadframe 68, base flange 40, and anchor regions 64 of internal shield structure 58. Molded package body 34 is produced to include an open upper end such that air cavity 36, not yet enclosed by cover piece 38, opens in an upward direction away from base flange 40. Molded package body 34 is formed to leave exposed the device mount areas of base flange 40 and proximal lead end portions 50 of package leads 22, 24, 26, 28, 30, 32. At some juncture following the molding process, selected portions of leadframe 68 may be severed or trimmed away including, for example, dam bars 72 and outer peripheral leadframe portion 74. Leadframe singulation or trimming therefore results electrical isolation of package leads 22, 24, 26, 28, 30, 32 and internal shield structure 58, which may otherwise be electrically bridged to base flange 40 by dam bars 72. A non-exhaustive list of processes suitable for singulating or trimming leadframe 68 include sawing, laser cutting, water jetting, stamping, scribing (with or without punching), and routing.

Figure 7:
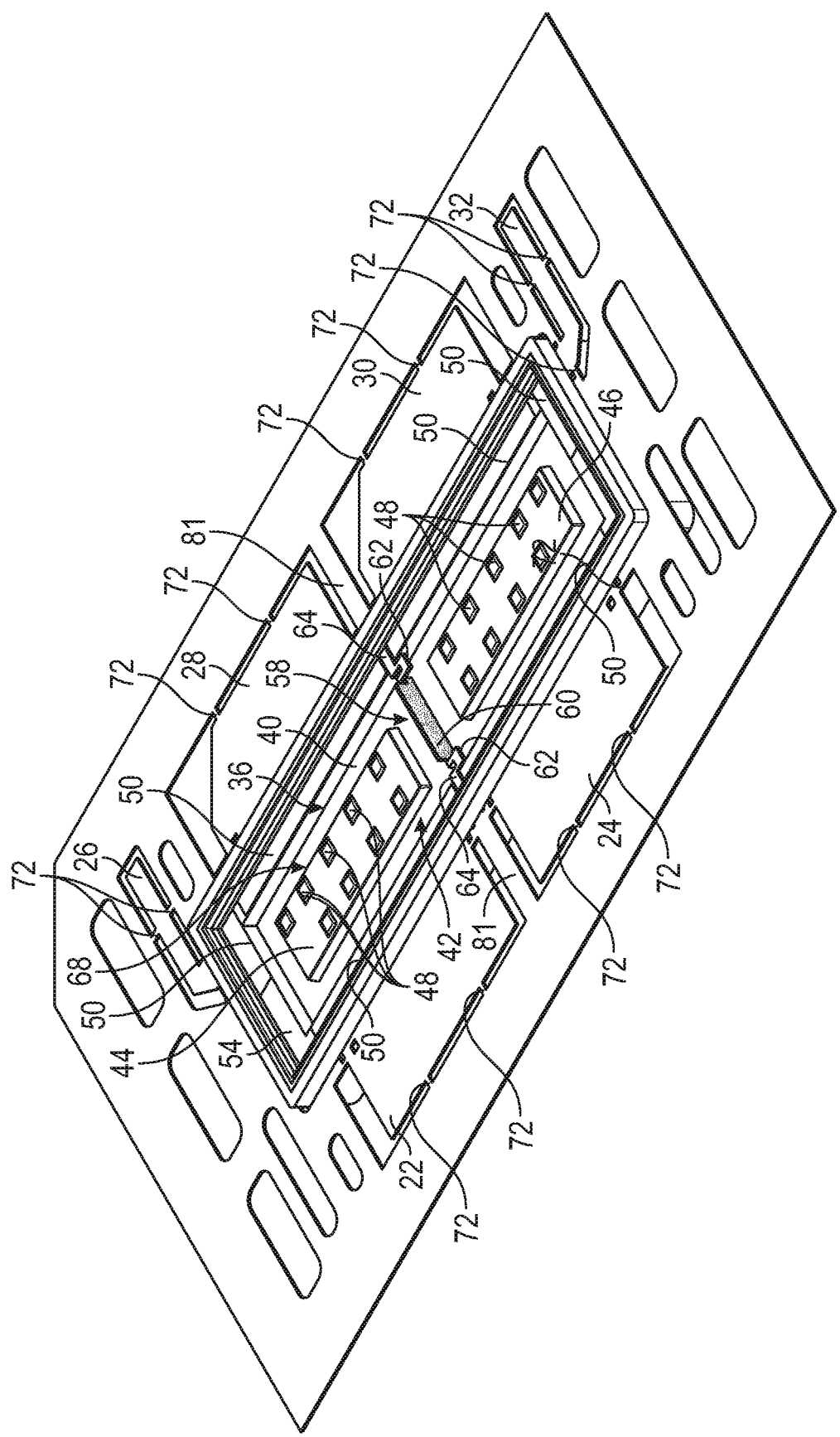

Microelectronic devices 44, 46 may now be installed within ACM package 20 by mounting or attachment to frontside 42 of base flange 40, as shown in FIG. 7. Device attachment can be performed utilizing any adhesive or bonding material including organic pressure-sensitive adhesives, such commercially-available die attach materials. Alternatively, device attachment may be conducted utilizing a metallic-based bonding process, such as a low temperature sintering process. Following device attachment, appropriate electrical interconnections are formed between the installed microelectronic device(s) and the terminals exposed from within the package interior. In the case of exemplary package 20, specifically, ball bonding or another wirebonding process is conveniently performed to form bondwires 56 electrically coupling bond pads 48 of microelectronic devices 44, 46 to the exposed upper surfaces of proximal end portions 50 of package leads 22, 24, 26, 28, 30, 32, as shown in FIG. 3. In other embodiments, a different interconnection technique can be utilized. Electrical testing may further be performed, if desired, following device attachment and prior to the below-described cover piece attachment operation.

To complete the package fabrication process and yield the completed version of microelectronic package 20 shown in FIGS. 1-3, cover piece 38 is attached to the upper peripheral edge portion of molded package body 34. In certain instances, a low temperature sintering process can be utilized to join cover piece 38 to molded package body 34. Alternatively, a flowable adhesive material, such as a high temperature epoxy or other die attachment material, may be utilized to bond cover piece 38 to molded package body 34. In this manner, air cavity 36 is sealingly enclosed after device installation and electrical interconnection. Finally, if not yet performed, leadframe 68 can be singulated or trimmed as previously-described to complete fabrication of package 20.

The foregoing has thus described a method for fabricating a microelectronic package (package 20) containing an internal shield structure (shield structure 58) formed as an integral part of a leadframe (leadframe 68). In further embodiments, the internal shield structure or structures integrated into a given internally-shielded microelectronic package may be provided or produced in various other manners. For example, the internal shield structure can be provided a discrete-fabricated structure or insert piece, which is bonded to, mechanically joined to, or otherwise affixed to infrastructure of the microelectronic package in some manner; e.g., in further embodiments of package 20, such an inserted shield structure may be joined to leadframe 68, flange frontside 42, or the underside of cover piece 38. In still other embodiments, the internal structure may be provided as integral portion of the underside of a cover piece or other structure (e.g., a window frame) from which the microelectronic (e.g., ACM) package is assembled. Examples of such alternative package architectures and manufacturing approaches will now be described in conjunction with FIGS. 8-11.

Further Examples of Internally-Shielded Microelectronic Packages

Figure 8:
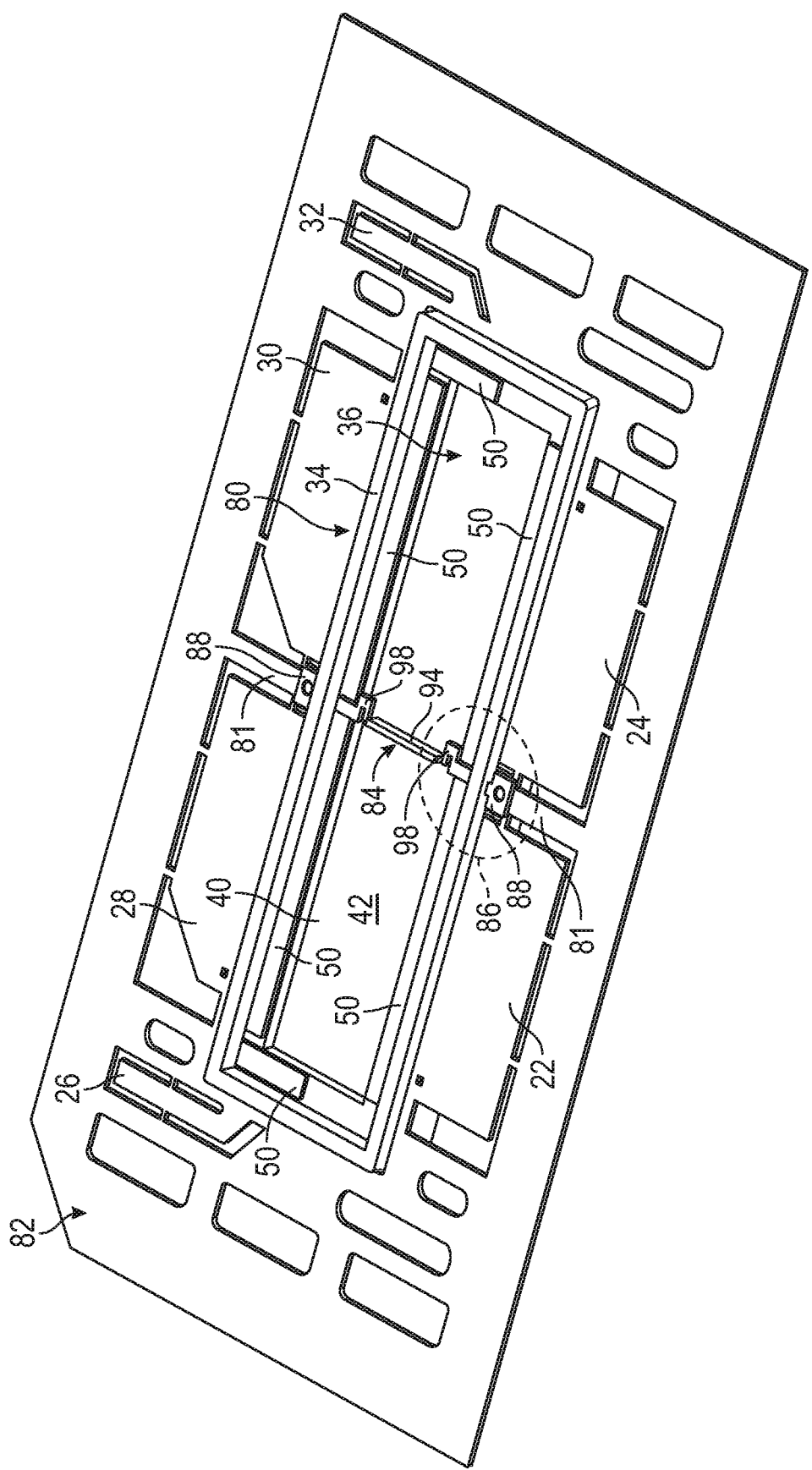
FIG. 8 is an isometric view of a second exemplary internally-shielded ACM package, which includes a discretely-fabricated shield insert piece or "inserted shield structure" and which is illustrated at an intermediate stage of manufacture.
Figure 9:
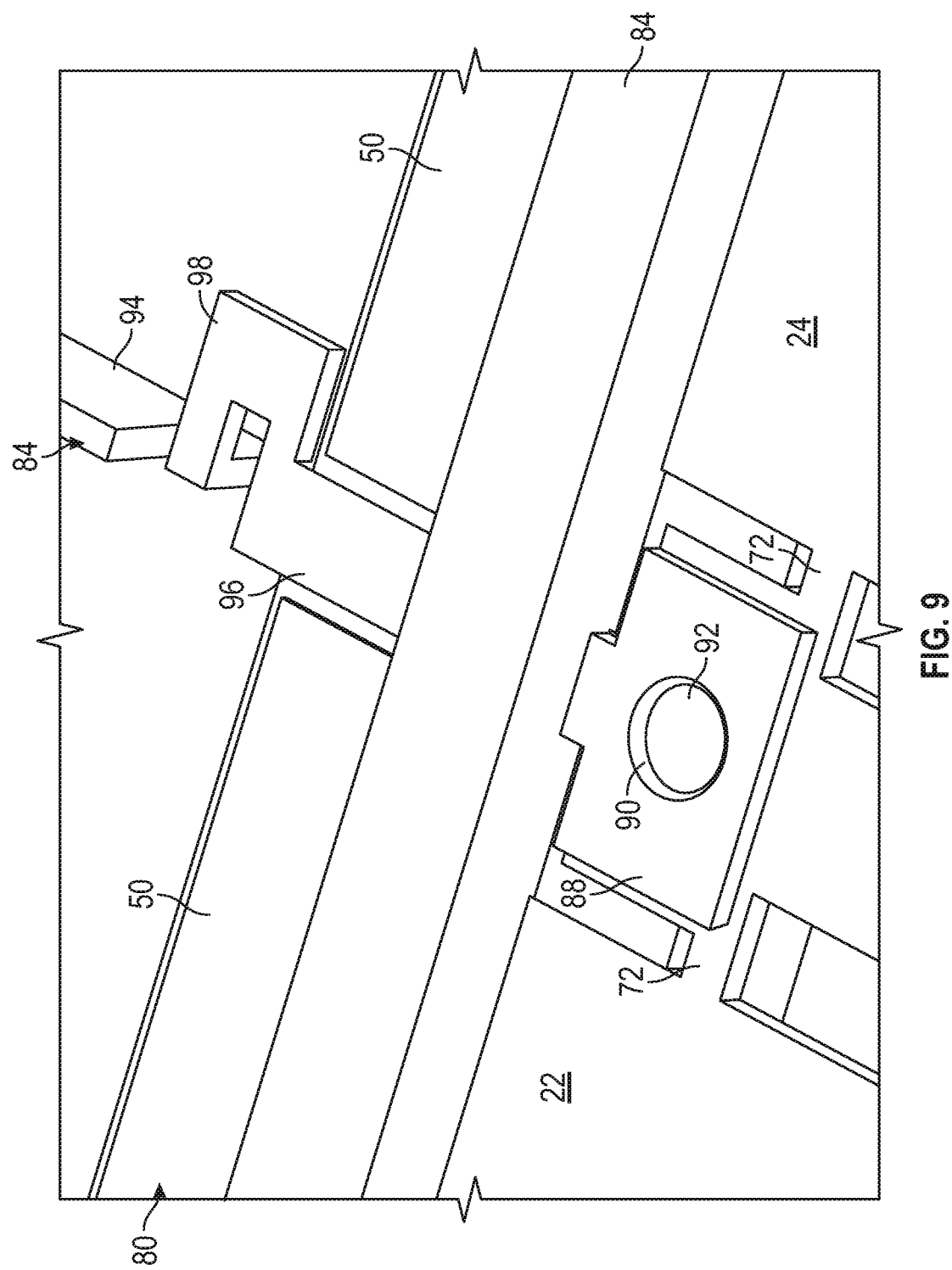
FIG. 9 is a detailed view illustrating one manner in which the inserted shield structure can be attached to the leadframe of the exemplary ACM package shown in FIG. 8 in embodiments.

FIG. 8 is an isometric view of an internally-shielded ACM package 80, which is illustrated in a partially-fabricated state and depicted in accordance with a further exemplary embodiment of the present disclosure. In many respects, internally-shielded ACM package 80 is similar to ACM package 20 described above in conjunction with FIGS. 1-7, with the illustrated stage of manufacture of package 80 most closely corresponding to that shown in FIG. 6 for package 20. Accordingly, the reference numerals introduced above have been carried over to FIG. 8, where appropriate, and portions of internally-shielded ACM package 80 already discussed will not be described again to avoid redundancy. For example, ACM package 80 is produced utilizing a leadframe 82, which is similar (although not identical) to leadframe 68 shown in FIGS. 4-8 and includes a number of package leads 22, 24 26, 28, 30, 32. Also, as was previously the case, base flange 40 is positioned against leadframe 82 and molded package body 34 is formed over and around selected portions of base flange and leadframe 82 to arrive at the stage of manufacture shown in FIG. 8.

Once again, ACM package 80 is fabricated to include an internal shield structure 84. However, in the embodiment of FIG. 8, internal shield structure 84 is provided as a discretely-fabricate structure or insert piece rather than as an integral portion of leadframe 82. Generally, by furnishing internal shield structure 58 as an insert piece (rather than as an integral portion of a leadframe) affords greater flexibility in the design and composition of structure 58, albeit with the tradeoff of a slight increase in manufacturing complexity. Such flexibility may be particularly useful when internal shield structure 58 and leadframe 82 are desirably fabricated from different materials. For example, in such embodiments, leadframe 82 may be produced from a first material (e.g., Cu) having a first electrical conductivity and a first magnetic permeability, while internal shield structure 84 is produced (at least in principal part) from a second material (e.g., Mu metal, electrical steel, an iron-rich alloy, or the like) having an electrically conductivity less than and a magnetic permeability greater than the first material. In such embodiments, internal shield structure 84 may be predominately composed of a such a magnetically-permeable material, by weight; and, in certain instances, may be plated with or otherwise coated with an electrically conductive material (e.g., a nickel-pallium-gold (NiPdAu) plating) for electrical shielding purposes. In other embodiments, internal shield structure 84 can be composed of a composite material containing magnetically-permeable (e.g., Fe or ferrite) particles or other filler; or any other material having a relative magnetic permeability ($\mu r$) exceeding 1000 and, more preferably, exceeding 10,000.

Internal shield structure 84 may be installed and secured within ACM package 80 at any stage in manufacture and can be joined to different components included within ACM package 80; e.g., shield structure 84 can be bonded to frontside 42 of base flange 40 as a freestanding structure or, instead, bonded to the underside of a non-illustrated cover piece in embodiments. In the illustrated example, specifically, internal shield structure 84 is positioned and secured within internally-shielded ACM package 80 prior to overmolding by attachment to leadframe 68. This may be more fully appreciated by referring to FIG. 8, which is a detailed view of one end portion of internal shield structure 84 and the surrounding package infrastructure, which corresponds to the region of package 80 identified in FIG. 7 by dashed circle 86. Here, it can be seen that the opposing end portions of internal shield structure 84 terminate in enlarged retention tabs 88. A fastener opening 90, such as a countersunk bores, is provided in each retention tab 88. Fasteners 92 are received through openings 90 and utilized to secure retention tabs 88 and, more broadly, shield structure 84 to leadframe 82. Fasteners 92 can be, for example, posts or pins integrally formed with or otherwise joined to leadframe 82, which are received through openings 90 and then deformed outwardly or expanded utilizing a staking operation to mechanically capture shield structure 84 against leadframe 82. In alternative embodiments, various other joined techniques can be utilized to attach shield structure 84 to leadframe 82 including, for example, bonding and spot welding. In addition to retention tabs 88, internal shield structure 84 includes a shield wall 94, anchor portions 96 joined to opposing ends of shield wall 94, and flexures 98 between shield wall 94 and anchor portions 96. Anchor portions 96 extend through molded package body 34 to connect to retention tabs 88, as shown.

Internal shield structure 84 may be formed with a relatively large number of like shield structures from a sheet or strip of magnetically-permeable material. In this case, a forming operation may be performed to rotate shield wall 94 into an upright orientation, with flexures 98 undergoing controlled bending to accommodate rotation of shield wall 94 in the previous-described manner. In other embodiments, internal shield structure 84 can be fabricated in another manner thereby eliminating the need for such forming processes and the provision of flexures 98. For example, in other embodiments, internal shield structure 84 can be fabricated from a magnetically-permeable alloy by casting or utilizing a three dimensional metal printing process, such as Direct Metal Laser Sintering (DMLS). Alternatively, and as indicated above, internal shield structure 84 can be produced by molding from a composite material containing magnetically-permeable (e.g., Fe or ferrite) particles or other filler. Various other constructions are also possible. For example, in another implementation, internal shield structure 84 may contain a core piece or portion fabricated from a first material and to which a magnetically-permeable sheet or strip is joined; e.g., by bonding or by physically clipping the magnetically-permeable strip onto shield wall 94 of structure 84. Following attachment of internal shield structure 84 to leadframe 68 and formation of molded package body 34, leadframe 82 may be trimmed. Trimming of leadframe 82 and, specifically, severing of dam bars 72 electrically isolates internal shield structure 84 from package leads 22, 24, 26, 28, 30, 32. Afterwards, device attachment (e.g., bonding of devices 44, 46 shown in FIG. 3), device interconnection, and attachment of a cover piece (e.g., cover piece 38 shown in FIGS. 1-2) may be performed to complete fabrication of ACM package 80, as previously described.

Figure 10:
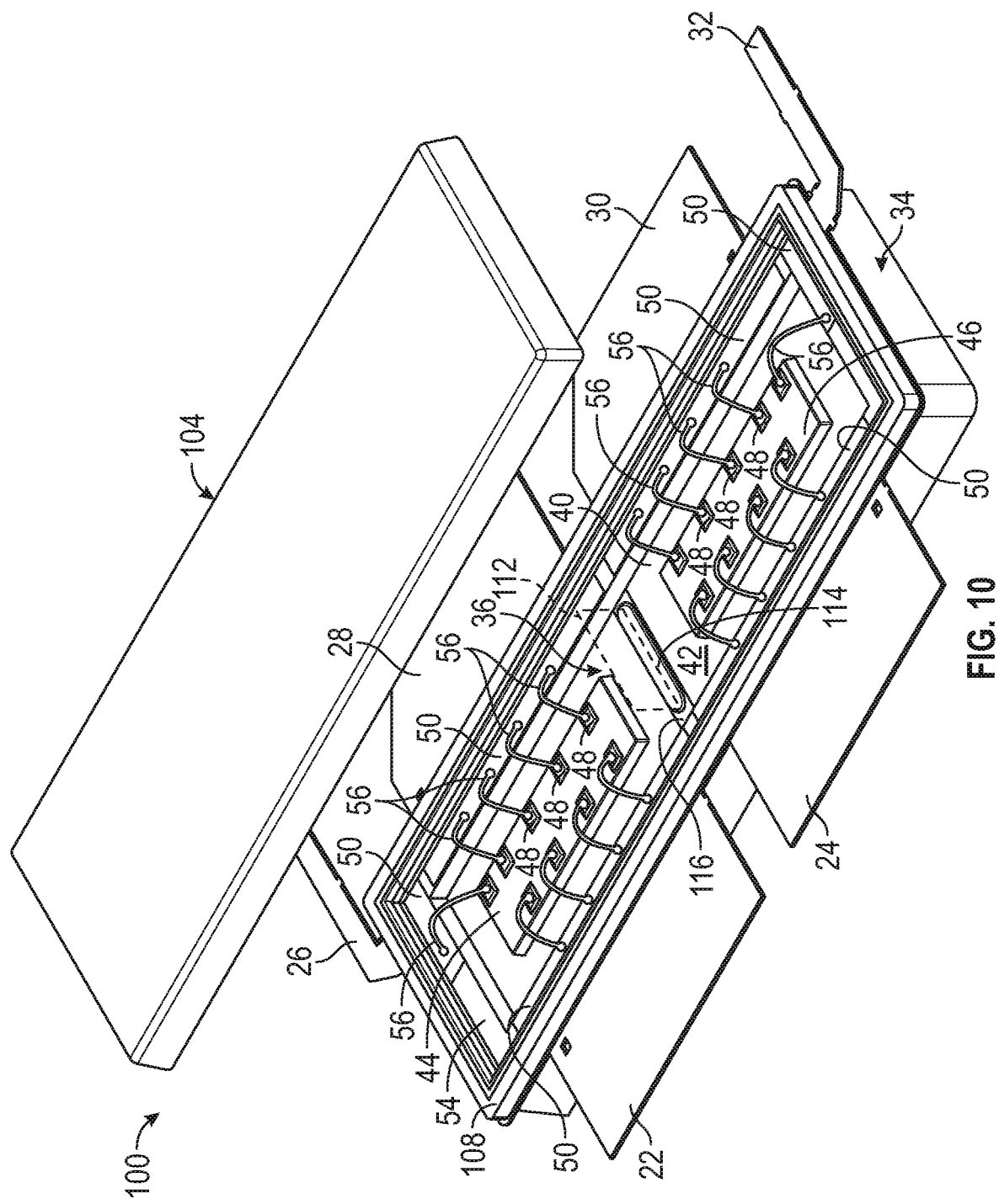
FIG. 10 is a partially exploded view of an internally-shielded ACM package including an internal shield structure attached to or integrally formed with underside of a cover piece, as illustrated in accordance with a still further exemplary embodiment of the present disclosure.
Figure 11:
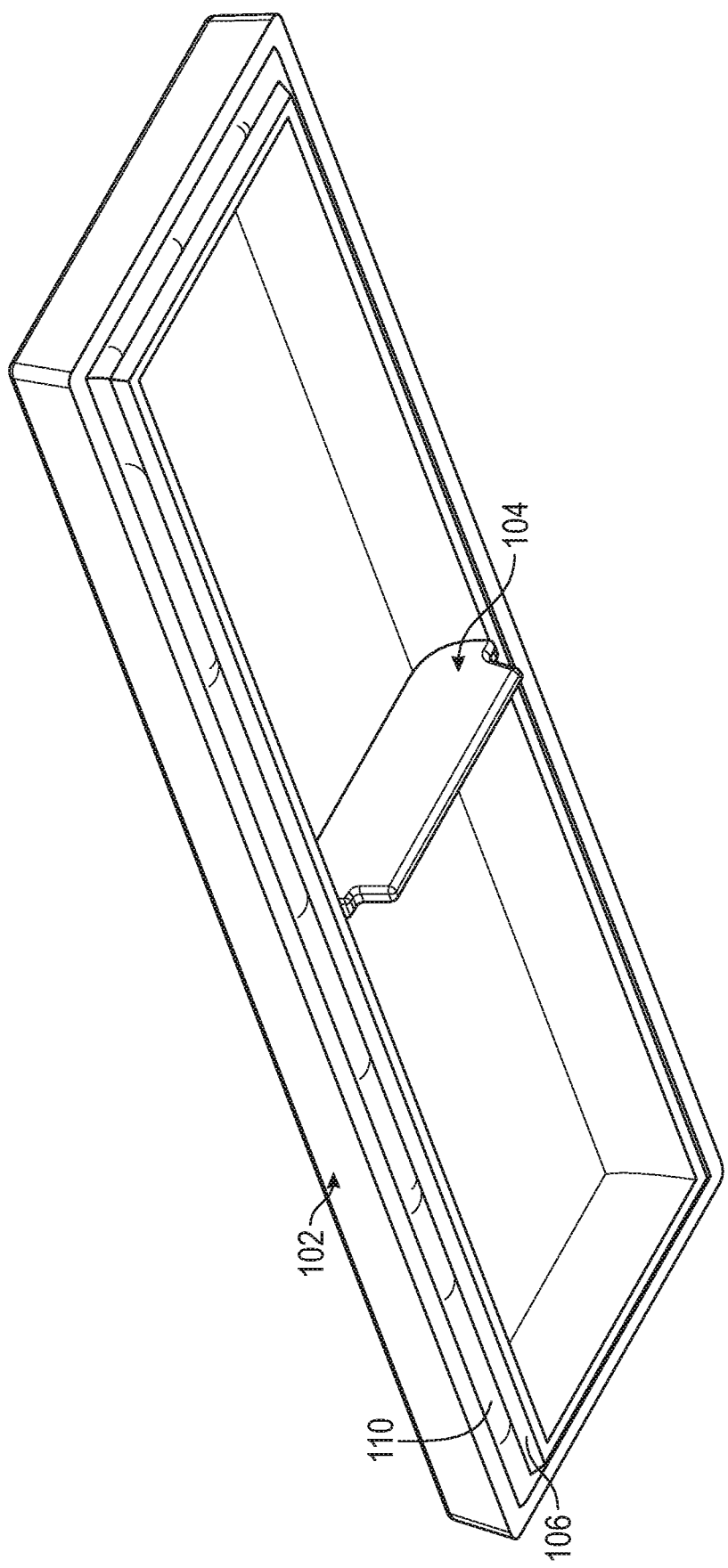
FIG. 11 is a lower isometric view of the cover piece contained the exemplary ACM package shown in FIG. 10 more clearly illustrating one manner in which the internal shield structure can be integrally formed with or otherwise joined to the cover piece.

In still further embodiments, the internal shield structure may be attached to or integrally formed with the underside of a cover piece included in the microelectronic (e.g., ACM) package. Further emphasizing this point, FIG. 10 is a partially exploded isometric view of a microelectronic package 100 illustrated in accordance with another exemplary embodiment of the present disclosure. Microelectronic package 100 is similar to package 80 (FIGS. 8-9) and package 20 (FIGS. 1-3), with like reference numerals carried forward where appropriate. Additionally, FIG. 11 further illustrates the underside of a cover piece 102, which is attached to molded package body 34 of microelectronic package 100 to enclose air cavity 36 and devices 44, 46 contained therein. As can be seen in FIG. 11, an internal shield structure 104 is coupled to the underside of cover piece 102. In embodiments, internal shield structure 104 may be integrally formed with cover piece 102. More specifically, internal shield structure 104 may have a core portion integrally formed with cover piece 102 by, for example, molding; and a magnetically permeable coating, paint, or plating may then be applied over the core portion. Alternatively, internal shield structure 104 may be separately fabricated and then adhered to the underside of cover piece 102 in the desired position. Cover piece 102 may also include various other structure features, such as a lower peripheral rim or lip 106, which engages an upper peripheral rim 108 of package body 34. A bead of adhesive 110 may further be applied around lip 106 for sealing and attachment purposes.

The positioning of internal shield structure 104, as considered when cover piece 102 is installed over molded package body 34, is indicated in FIG. 10 by dashed rectangle 112. As can be seen, when cover piece 102 is properly positioned over package body 34, the lower edge of internal shield structure 104 may be matingly or conformally received within a groove, slot, or open trench 116 formed in a central portion of flange frontside 42. If desired, a body or layer of bonding material 114 may be dispensed or otherwise provided at the juncture between the lower edge of shield structure 104 and flange frontside 42; e.g., bonding material 114 may partially fill trench 116 when provided. Bonding material 114 may be provided to help secure cover piece 102 to package body 34 and to further help retain shield structure 104 in its desired position. Additionally or alternatively, bonding material 114 may be provided for electrical interconnection purposes and, specifically, to electrically join internal shield structure 104 to base flange 40; e.g., in an embodiment, shield structure 104 may be coupled to electrical ground through bonding material 114 and base flange 40. In such embodiments, bonding material 114 may be composed of a metal-filled epoxy, a sintered metallic material, or another electrically-conductive adhesive.

CONCLUSION

There has thus been provided embodiments of internally-shielded microelectronic packages containing EM shield structures, as well as methods for producing such microelectronic packages. Such internal shield structures favorably reduce EM cross-coupling between different signal paths contained in the microelectronic packages, even the assembly is operated at higher (e.g., RF) power levels and is imparted with a relatively compact form factor. While principally described above in the context of high power RF applications, the EM-shielded microelectronic packages can be utilized in various different applications in which EM cross-coupling between different signal lines is problematic, whether the signal paths carry digital signals (e.g., as in the case of clock lines), analog signals, or a combination thereof.

In various embodiments, the internally-shielded microelectronic package includes a substrate, such as a base flange, having a frontside and a longitudinal axis. A first microelectronic device mounted to the frontside of the substrate, while a second microelectronic device further mounted to the frontside of the substrate and spaced from the first microelectronic device along the longitudinal axis. An internal shield structure includes or consists of a main body or shield wall, which is positioned between the first and second microelectronic devices as taken along the longitudinal axis. The internal shield structure at least partially composed of a magnetically-permeable material (e.g., a material having a relative magnetic permeability ($\mu_r$) exceeding 1000 and, perhaps, exceeding 10,000) decreasing EM cross-coupling between the first and second microelectronic devices during package operation. In some implementations, the microelectronic package may further include a first pair of package leads to which the first microelectronic device is electrically coupled, as well as a second pair of package leads to which the second microelectronic device is electrically coupled, with the first pair of package leads, the second pair of package leads, and the internal shield structure comprise singulated pieces of a leadframe. In certain cases, the internally-shielded microelectronic package may further include a package body in which the first microelectronic device and the second microelectronic device are contained, as well as first and second package leads extending from a side of the package body. In such cases, the internal shield structure may further include a shield extension projecting from the package body and extending between the first and second package leads.

In other embodiments, the internally-shielded microelectronic package includes a first microelectronic device (e.g., a first semiconductor die), a second microelectronic device (e.g., a second semiconductor die), and a package body (e.g., a molded package body) containing the first and second microelectronic devices. An internal shield structure includes or consists of a shield wall, which is further contained within the package body. The shield wall is positioned between and, thus, physically partitions the first and second microelectronic devices. The shield wall includes, in turn, (i) a magnetically-permeable layer or portion having a first magnetic permeability and a first electrical conductivity, and (ii) an electrically-conductive layer or portion bonded to the magnetically-permeable layer. The electrically-conductive layer has a second magnetic permeability less than the first magnetic permeability and has a second electrical conductivity greater than the first electrical conductivity. In certain embodiments, the magnetically-permeable layer may assume the form of a singulated piece of a leadframe over which the electrically-conductive layer is deposited; e.g., in such embodiments, the body of leadframe may be composed of a Mu metal, a permalloy, or another material having a relatively high magnetic permeability, with an electrically-conductive layer (e.g., a CuNiPdAu-containing alloy) plated or otherwise deposited over portions of the leadframe forming the shield wall and, perhaps, the internal shield structure generally. The electrical-conductive layer can also be plated over other regions of the leadframe across which electrical conductivity is desired; e.g., portions of the leadframe forming package leads. In still other instances, this relationship may be reversed such that the leadframe body is composed of an electrically-conductive material (e.g., Cu) and a magnetically-permeable layer is plated or otherwise deposited over those regions of the leadframe serving as the internal shield structure.

Methods for fabricating internally-shielded microelectronic packages have further been provided. In embodiments, the method includes the steps or processes of (i) providing a substrate having a frontside, (ii) mounting first and second microelectronic devices to the frontside of the substrate, and (iii) positioning a shield wall between the first and second microelectronic devices before or after mounting the microelectronic devices to the frontside of the substrate. The shield wall at least partially composed of a magnetically-permeable material (e.g., a material having a relative magnetic permeability ($\mu_r$) exceeding 1000 and, perhaps, exceeding 10,000), which decreases EM cross-coupling between the f microelectronic devices during package operation. In certain embodiments, the method may further include attaching the substrate to a leadframe and forming (e.g., via overmolding) a package body bonded to the leadframe. The package body is formed to contain the microelectronic devices and the shield wall; e.g., in certain embodiments, the package body may peripherally bound or otherwise help define an air cavity in which the microelectronic devices and the shield wall are located. An internal shield structure (in which the shield wall is included) may further be provided, with the internal shield structure fixedly connected to the leadframe. For example, in such embodiments, the shield structure may be integrally formed with the leadframe (e.g., as described above in conjunction with FIGS. 4-7) or provided as a discrete piece or insert, which is staked or otherwise affixed to the leadframe b (e.g., as described above in conjunction with FIGS. 8-9). In still other embodiments in which the substrate assumes the form of a base flange serving as a ground terminal of the microelectronic package, the method may further include the step or process of forming an electrical connection between the shield wall and the base flange; e.g., by disposing an electrically-conductive adhesive at a juncture between a lower edge of the shield wall and the frontside of the base flange.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An internally-shielded microelectronic package, comprising:
 a substrate having a frontside and a longitudinal axis;
 a first microelectronic device mounted to the frontside of the substrate;
 a second microelectronic device further mounted to the frontside of the substrate and spaced from the first microelectronic device along the longitudinal axis; and
 an internal shield structure comprising a shield wall positioned between the first and second microelectronic devices as taken along the longitudinal axis, the internal shield structure at least partially composed of a magnetically-permeable material decreasing electromagnetic cross-coupling between the first and second microelectronic devices during operation of the internally-shielded microelectronic package, the internal shield structure comprising:
  an electrical shield layer; and
  a magnetic shield layer having a magnetically permeability greater than that of the electrical shield layer and having an electrically conductivity less than that of the electrical shield layer.

2. The internally-shielded microelectronic package of claim 1 wherein the substrate comprises a base flange contacted by the internal shield structure.

3. The internally-shielded microelectronic package of claim 2 wherein the internal shield structure is further composed of an electrically-conductive material coupled to electrical ground through the base flange.

4. The internally-shielded microelectronic package of claim 1 wherein one of the magnetic shield layer and the electrical shield layer is plated onto the other of the magnetic shied layer and the electrical shield layer.

5. The internally-shielded microelectronic package of claim 1 further comprising:
 a first pair of package leads to which the first microelectronic device is electrically coupled; and
 a second pair of package leads to which the second microelectronic device is electrically coupled;
 wherein the first pair of package leads, the second pair of package leads, and the internal shield structure comprise singulated pieces of a leadframe.

6. The internally-shielded microelectronic package of claim 1 wherein the first microelectronic device has a first height as taken along an axis orthogonal to the frontside of the substrate, wherein the second microelectronic device has a second height as taken along the axis, and wherein the internal shield structure comprises a shield wall having a height exceeding the first and second heights.

7. The internally-shielded microelectronic package of claim 1 further comprising:
 a package body; and
 a bond pad shelf extending around an inner periphery of the package body, the internal shield structure extending between opposing edges of the bond pad shelf.

8. The internally-shielded microelectronic package of claim 7 wherein the bond pad shelf has a first width and the internal shield structure has a second width as taken along an axis orthogonal to the longitudinal axis, the second width equal to or greater than one half the first width.

9. The internally-shielded microelectronic package of claim 1 further comprising:
 a package body at least partially defined by the substrate; and
 a cover piece bonded to the package body and to which the internal shield structure is attached.

10. An internally-shielded microelectronic package, comprising:
 a substrate having a frontside and a longitudinal axis;
 a first microelectronic device mounted to the frontside of the substrate;
 a second microelectronic device further mounted to the frontside of the substrate and spaced from the first microelectronic device along the longitudinal axis;
 an internal shield structure comprising a shield wall positioned between the first and second microelectronic devices as taken along the longitudinal axis, the internal shield structure at least partially composed of a magnetically-permeable material decreasing electromagnetic cross-coupling between the first and second microelectronic devices during a package body at least partially defined by the substrate; and
 a cover piece bonded to the package body and to which the internal shield structure is attached, at least a portion of the internal shield structure integrally formed with the cover piece.

11. The internally-shielded microelectronic package of claim 1 further comprising an open trench formed in the frontside of the substrate, the internal shield structure having a lower edge portion received in the open trench.

12. The internally-shielded microelectronic package of claim 1 further comprising:
 a first lead;
 a first bondwire array electrically interconnecting the first microelectronic device with the first lead;
 a second lead spaced from the first lead as taken the longitudinal axis; and
 a second bondwire array electrically interconnecting the second microelectronic device with the second lead, a portion of the internal shield structure further located between first bondwire array and the second bondwire array as taken along the longitudinal axis.

13. The internally-shielded microelectronic package of claim 1 wherein the first microelectronic device comprises a first transistor die, wherein the second microelectronic device comprises a second transistor die, and wherein the first and second transistor die comprise radio frequency power amplification circuitry.

14. The internally-shielded microelectronic package of claim 1 further comprising:
 a package body containing the first microelectronic device and the second microelectronic device; and
 first and second package leads extending from a side of the package body, the first and second package leads electrically coupled to the first microelectronic device and to the second microelectronic device, respectively;
 wherein the internal shield structure further comprises a shield extension projecting from the package body and extending between the first and second package leads.

15. An internally-shielded microelectronic package, comprising:
 a first microelectronic device;
 a second microelectronic device;
 a package body containing the first and second microelectronic devices; and
 an internal shield structure comprising a shield wall located within the package body and positioned between the first and second microelectronic devices, the shield wall comprising:
  a magnetically-permeable portion having a first magnetic permeability and a first electrical conductivity; and an electrically-conductive portion bonded to the magnetically-permeable layer, the electrically-conductive portion having a second magnetic permeability less than the first magnetic permeability and having a second electrical conductivity greater than the first electrical conductivity.

16. The internally-shielded microelectronic package of claim 15 wherein the magnetically-permeable portion comprises a singulated piece of a leadframe, and wherein the electrically-conductive portion comprises an electrically-conductive layer deposited over the singulated piece of the leadframe.

17. The internally-shielded microelectronic package of claim 15 further comprising a leadframe including a wall section bent into a generally upright position, the wall section at least partly defining the magnetically-permeable portion of the internal shield structure.

18. The internally-shielded microelectronic package of claim 15 further comprising a leadframe including a wall section bent into a generally upright position, the wall section at least partly defining the electrically-conductive portion of the internal shield structure.

19. The internally-shielded microelectronic package of claim 10 wherein the substrate comprises a base flange through which at least a portion of the internal shield structure is electrically coupled to ground.

20. The internally-shielded microelectronic package of claim 10 wherein the internal shield structure comprises:
 an electrical shield layer; and
 a magnetic shield layer having a magnetically permeability greater than that of the electrical shield layer and having an electrically conductivity less than that of the electrical shield layer, one of the magnetic shield layer and the electrical shield layer deposited onto the other of the magnetic shied layer and the electrical shield layer.

* * * * *